United States Patent
Vella-Coleiro

(10) Patent No.: US 8,792,583 B2
(45) Date of Patent: Jul. 29, 2014

(54) LINEARIZATION IN THE PRESENCE OF PHASE VARIATIONS

(75) Inventor: George P. Vella-Coleiro, Summit, NJ (US)

(73) Assignee: Andrew LLC, Hickory, NC (US)

( * ) Notice: Subject to any disclaimer, the term of this patent is extended or adjusted under 35 U.S.C. 154(b) by 317 days.

(21) Appl. No.: 13/370,544

(22) Filed: Feb. 10, 2012

(65) Prior Publication Data

US 2012/0286864 A1  Nov. 15, 2012

Related U.S. Application Data

(60) Provisional application No. 61/485,171, filed on May 12, 2011.

(51) Int. Cl.
 *H04K 1/02* (2006.01)
 *H04L 27/36* (2006.01)
 *H03F 1/32* (2006.01)
 *H03F 3/24* (2006.01)

(52) U.S. Cl.
 CPC ............... *H03F 3/24* (2013.01); *H04L 27/368* (2013.01); *H03F 1/3294* (2013.01); *H03F 1/3247* (2013.01); *H03F 2200/336* (2013.01)
 USPC ...... 375/296; 375/297; 455/114.2; 455/114.3

(58) Field of Classification Search
 CPC ... H03F 1/3247; H03F 1/3294; H04L 27/368; H04B 2001/0425; H04B 2001/0433
 USPC ...................... 375/296, 297; 455/114.2, 114.3
 See application file for complete search history.

(56) References Cited

U.S. PATENT DOCUMENTS

| | | | |
|---|---|---|---|
| 4,635,239 A * | 1/1987 | Neff | 367/47 |
| 5,109,303 A | 4/1992 | Feild | |
| 5,262,755 A * | 11/1993 | Mak et al. | 375/260 |
| 6,774,834 B2 * | 8/2004 | Dartois | 341/144 |
| 7,042,286 B2 * | 5/2006 | Meade et al. | 330/149 |

(Continued)

FOREIGN PATENT DOCUMENTS

| EP | 0169321 A2 | 1/1989 |
|---|---|---|
| WO | WO2010136390 A1 | 12/2010 |

OTHER PUBLICATIONS

International Search Report and Written Opinion; Mailed Sep. 6, 2012 for corresponding PCT Application No. PCT/US2012/035959.

*Primary Examiner* — Sophia Vlahos
(74) *Attorney, Agent, or Firm* — Mendelsohn, Drucker & Dunleavy, P.C.; Steve Mendelsohn

(57) ABSTRACT

In one embodiment, a non-linear power amplifier generates an amplified output signal based on a pre-distorted signal generated by a digital pre-distorter based on an input signal. A feedback path generates a feedback waveform based on the amplified output signal. The feedback waveform is aligned in time with the input signal at the waveform level to identify a corresponding reference waveform. The feedback waveform and the corresponding reference waveform are both divided into a plurality of sub-waveforms. Each feedback sub-waveform is independently aligned in phase with its corresponding reference sub-waveform. The resulting plurality of phase-aligned feedback sub-waveforms are then combined to form a hybrid-aligned waveform that is compared to the reference waveform to adaptively update the digital pre-distorter.

9 Claims, 3 Drawing Sheets

(56) References Cited

U.S. PATENT DOCUMENTS

| | | |
|---|---|---|
| 7,127,389 B2 | 10/2006 | Chazan et al. |
| 7,469,491 B2 | 12/2008 | McCallister et al. |
| 8,295,394 B1 * | 10/2012 | Broadwell et al. ............ 375/296 |
| 8,301,090 B2 * | 10/2012 | Brown et al. .............. 455/114.3 |
| 2003/0163260 A1 | 8/2003 | Moerig et al. |
| 2004/0247042 A1 * | 12/2004 | Sahlman ........................ 375/297 |
| 2005/0163205 A1 * | 7/2005 | McCallister .................. 375/229 |
| 2011/0163805 A1 | 7/2011 | Brown et al. |

* cited by examiner

LINEARIZATION IN THE PRESENCE OF PHASE VARIATIONS

CROSS-REFERENCE TO RELATED APPLICATIONS

This application claims the benefit of the filing date of U.S. provisional application No. 61/485,171, filed on May 12, 2011, the teachings of which are incorporated herein by reference in their entirety.

BACKGROUND

1. Field of the Invention

The present invention relates to signal processing and, more specifically but not exclusively, to linearizing non-linear systems, such as linearizing non-linear amplifiers using digital pre-distortion.

2. Description of the Related Art

Modern wireless communications systems require transmitters with a high degree of linearity in order not to interfere with other systems that occupy adjacent radio frequencies. In order to achieve high power efficiency, however, power amplifiers are operated close to saturation where the output is highly non-linear.

In many wireless communication systems, the transmitted RF signal is generated by applying a digital input signal to a sequence of processing that includes digital pre-distortion (DPD), followed by digital-to-analog (D/A) conversion, followed by analog upconversion from baseband or an intermediate frequency (IF) to a radio frequency (RF) prior to transmission, followed by non-linear power amplification, where the DPD processing is intended to compensate for non-linearities in the rest of the processing sequence, especially non-linearities in the amplifier that performs the power amplification.

In such a conventional DPD-based amplifier system, a portion of the RF output signal generated at the amplifier is periodically tapped, downconverted from RF, digitized, and demodulated to form a complex, digital feedback signal that is compared to the complex, digital input signal to characterize the existing distortion in the RF output signal and adjust the DPD processing to attempt to compensate for that distortion. Adjusting the DPD processing is typically implemented by performing certain calculations to update one or more look-up tables (LUTs) that represent the pre-distortion needed to compensate for the distortion in the RF output signal. These LUTs are then used to pre-distort the digital input signal until the next periodic update is performed. To avoid introducing noise into the LUTs, the tapped portion of the RF output signal needs to contain a large number of samples so that the random fluctuations can be made negligible by averaging. For example, in a conventional wireless communication system that generates an RF output signal with a bandwidth of 15 MHz, each tapped portion of the RF output signal is typically about 100 microseconds long, and the LUTs are typically updated once every 10 to 100 milliseconds.

Before the digital feedback signal is compared to the digital input signal, the two signals are typically aligned in both time and phase. These time and phase alignments are typically performed in the digital domain within the same digital processor that performs the DPD processing. For the rest of this specification, in the context of processing designed to update the DPD LUTs, the input signal will be referred to as the "reference" signal to which the feedback signal gets compared.

In particular, time alignment is achieved by shifting in time either the reference signal or the feedback signal so as to minimize, in a least-squares sense, the difference between (i) the power (or, alternatively, the amplitude) of the digital feedback waveform corresponding to the current tapped portion of the RF output signal and (ii) the power (amplitude) of a corresponding waveform of the digital reference signal. Similarly, phase alignment is achieved by shifting the phase of one of the two waveforms so as to minimize, in a least-squares sense, the sum of the squares of the differences between (i) the complex (i.e., in-phase (I) and quadrature-phase (Q)) components of the digital feedback waveform corresponding to the current tapped portion of the RF output signal and (ii) the complex components of the corresponding (i.e., time-aligned) digital reference waveform.

Operationally, time alignment is first performed between the two signals over the entire duration of the tapped portion (i.e., at the waveform level). Then, phase alignment is performed between the resulting time-aligned waveforms over that same entire duration (i.e., at the waveform level). Time alignment is performed to adjust for the delays that occur in both the transmit chain and in the feedback chain. Phase alignment is performed because, in addition to the phase variation introduced by the AM-PM (amplitude modulation to phase modulation) distortion of the amplifier, there is an arbitrary phase difference between the reference and feedback waveforms, which needs to be removed before the waveforms are compared to extract the AM-PM distortion. Ideally, this phase difference is constant for the duration of the feedback waveform, in which case, the phase difference can be removed by multiplying the feedback waveform with a complex number whose value is chosen to minimize the difference between the reference and feedback waveforms in a least squares sense or other suitable measure.

The following Equation (1) represents a closed-form expression for a complex multiplier M that aligns the phase (and also the magnitude) of a sequence of waveform samples tapped from the time-aligned RF output signal with the corresponding sequence of samples from the time-aligned digital reference waveform:

$$M=(C'^{*}R)/(C'^{*}C), \quad (1)$$

where C is the sequence of complex samples (I+jQ) corresponding to the time-aligned feedback waveform in the form of a column vector, R is the corresponding sequence of complex samples of the time-aligned reference waveform also in the form of a column vector, and C' is the transpose of C. The symbol * in Equation (1) signifies matrix multiplication.

The phase- and time-aligned version of the feedback waveform is given by the following Expression (2):

$$M*C, \quad (2)$$

where the symbol * in Equation (2) signifies element-by-element multiplication, since M is a single complex number.

SUMMARY

In practice, there exist various mechanisms that result in the arbitrary phase difference varying, partly systematically and partly randomly, during the duration of the feedback waveform. In such cases, removing the average phase difference by multiplying the time-aligned feedback waveform with a single complex number (i.e., at the waveform level) leaves phase variations that limit the ability to correct the distortion of the transmit chain using DPD.

In one embodiment, the present invention is a machine-implemented method for phase-aligning a first waveform to a second waveform. The first waveform is divided into a plurality of first sub-waveforms, and the second waveform is divided into a plurality of second sub-waveforms, wherein each second sub-waveform corresponds to a different first sub-waveform. Each first sub-waveform is independently phase-aligned to its corresponding second sub-waveform at a sub-waveform level. The plurality of independently phase-aligned first sub-waveforms are combined to form a combined waveform.

In another embodiment, the present invention is a linearized system comprising an adaptive pre-distorter, a non-linear transmit path, and a feedback path. The adaptive pre-distorter is configured to pre-distort an input signal to generate a pre-distorted signal. The non-linear transmit path is configured to generate an output signal from the pre-distorted signal. The feedback path is configured to generate a feedback waveform based on the output signal. The adaptive pre-distorter is configured to be adapted by (1) time aligning the feedback waveform with a corresponding input reference waveform of the input signal at a waveform level; (2) dividing the time-aligned feedback waveform into a plurality of feedback sub-waveforms; (3) dividing the corresponding input reference waveform into a plurality of input reference sub-waveforms; (4) independently phase aligning each feedback sub-waveform and its corresponding input reference sub-waveform at a sub-waveform level to form a plurality of phase-aligned sub-waveforms; (5) combining the plurality of phase-aligned sub-waveforms to form a hybrid-aligned waveform; and (6) updating the adaptive pre-distorter based on the hybrid-aligned waveform.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
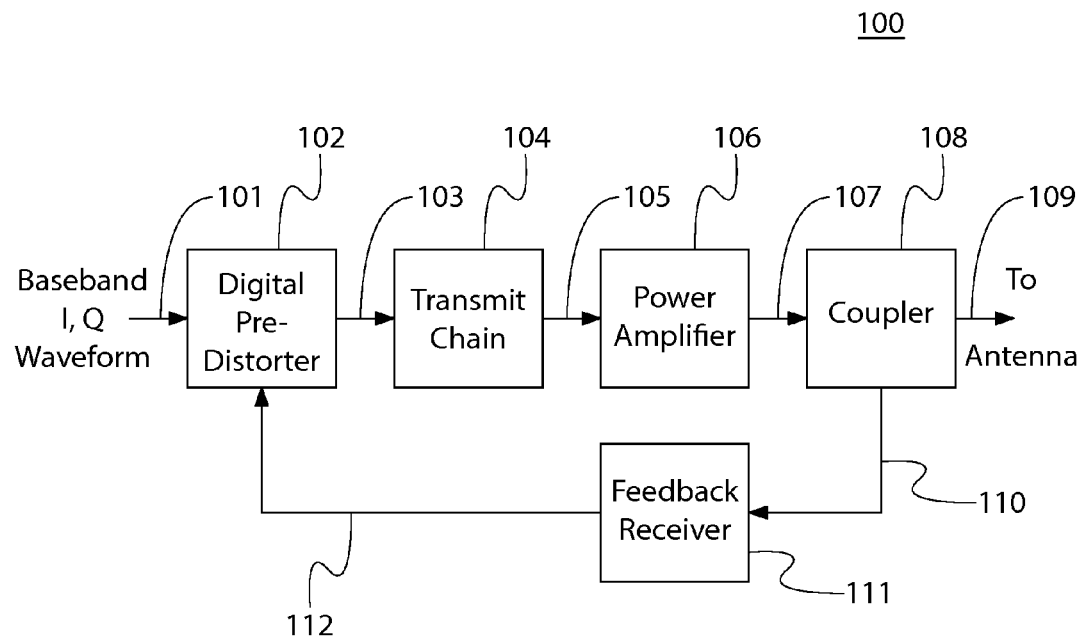
FIG. 1 shows a block diagram of an amplifier system, according to one embodiment of the present invention.

FIG. 1 shows a block diagram of an amplifier system 100, according to one embodiment of the present invention. Amplifier system 100 receives a complex, digital, baseband input signal 101 (e.g., having I (in-phase) and Q (quadrature) components) and generates an amplified, analog, RF output signal 109 for application, for example, to a transmitting antenna. Amplifier system 100 includes (i) a digital pre-distortion (DPD) processor 102, (ii) a transmit path having a transmit chain 104, a power amplifier 106, and a coupler 108, and (iii) a feedback path having a feedback receiver 111. In an alternative embodiment, input signal 101 could be at an intermediate frequency (IF) rather than at baseband.

DPD processor 102 applies DPD processing to digital input signal 101 to generate a complex, digital, pre-distorted signal 103. Transmit chain 104 converts the complex DPD signal 103 from the digital baseband domain into an analog RF domain to generate analog RF signal 105. In one possible implementation, transmit chain 104 includes a digital-to-analog (D/A) converter that converts DPD signal 103 into an analog signal followed by an upconverting mixer that converts that analog signal into RF signal 105. In addition, transmit chain 104 has a modulator that combines the I and Q components, where, depending on the implementation, the modulator is implemented digitally or as a separate analog IQ modulator, e.g., located after the D/A converter. Power amplifier 106 amplifies RF signal 105 to generate amplified RF signal 107. Coupler 108 taps off a small portion of RF signal 107 as RF tap signal 110, with the remainder of RF signal 107 being provided to the antenna as RF output signal 109.

In the feedback path, feedback receiver 111 converts RF tap signal 110 from the analog RF domain into feedback signal 112 in the same complex, digital, baseband domain as input signal 101. In one possible implementation, feedback receiver 111 includes (i) a downconverting mixer to convert RF tap signal 110 into an analog IF signal, (ii) an analog-to-digital (A/D) converter to convert the analog IF signal into a digital IF signal, and (iii) a demodulator to convert the digital IF signal into the complex, digital, baseband I and Q components of feedback signal 112. In another possible implementation, feedback receiver 111 includes (i) an I/Q demodulator to convert RF tap signal 110 into analog, baseband I and Q components and (ii) dual A/D converters to convert the analog, baseband I and Q components into the complex, digital, baseband I and Q components of feedback signal 112. Other implementations are also possible.

In one implementation, DPD processor 102 applies DPD processing to input signal 101 using one or more lookup tables (LUTs) that represent and pre-compensate for the estimated distortion that will be applied to the signal by the elements downstream of DPD processor 102, which distortion is primarily generated by power amplifier 106, in order to linearize the overall response of amplifier system 100.

In an adaptive embodiment, DPD processor 102 periodically updates those LUTs to track changes in that downstream distortion over time. The conventional processing implemented by DPD processor 102 to update the LUTs is based on a comparison of feedback signal 112 to reference signal 101 in order to characterize the differences between those two signals, where the LUTs are modified in an attempt to eliminate those differences. Before those two signals are compared for that purpose, however, they need to be aligned in both time and phase.

Figure 2:
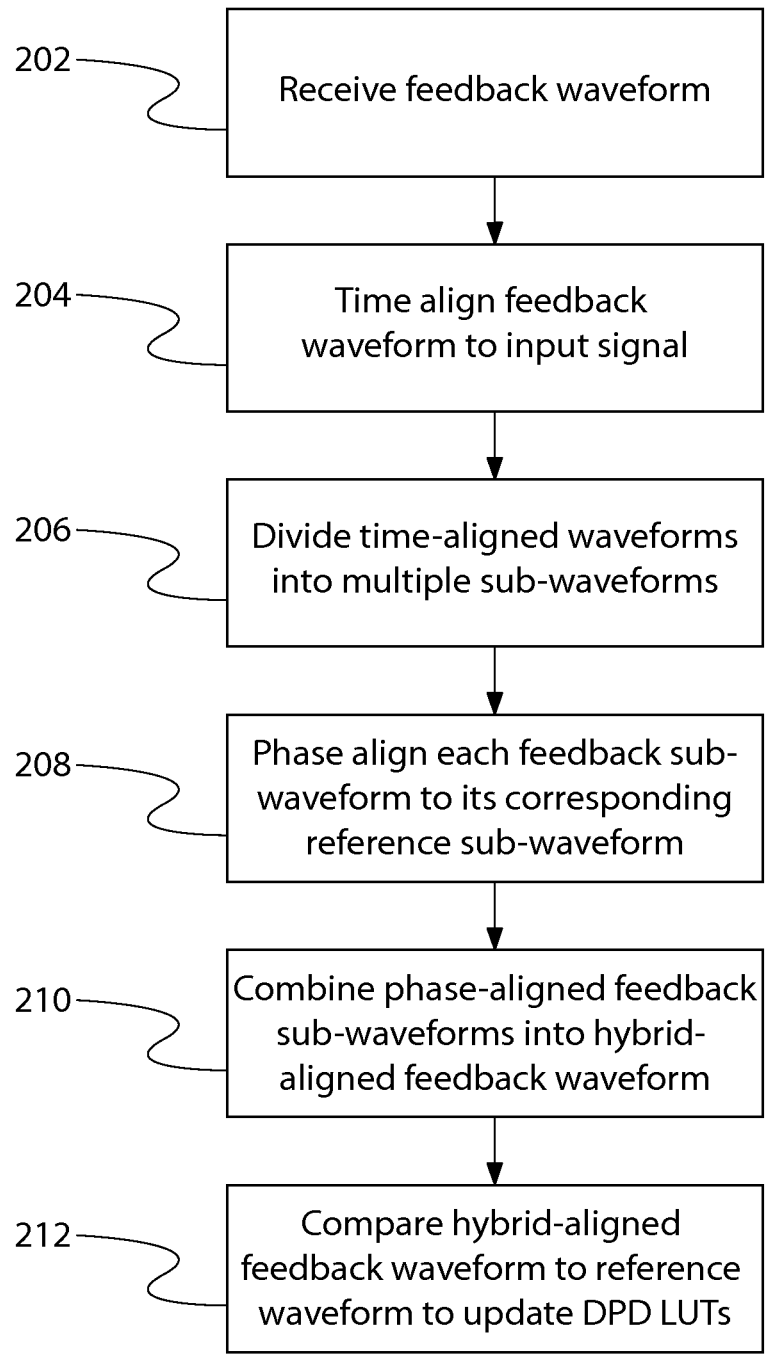
FIG. 2 shows a flow diagram of the processing implemented by the DPD processor of FIG. 1 to update the LUTs used to pre-distort the input signal, according to one embodiment of the present invention.

FIG. 2 shows a flow diagram of the processing implemented by DPD processor 102 to update the LUTs used to pre-distort input signal 101, according to one embodiment of the present invention. In step 202, DPD processor 102 receives, from feedback receiver 111, a feedback waveform corresponding to a temporal portion of feedback signal 112. In one typical implementation, the feedback waveform corresponds to a portion of feedback signal 112 having a duration of 106.6 microseconds.

In step 204, DPD processor 102 performs (e.g., conventional least-squares-based) processing to temporally align the feedback waveform with a corresponding, 106.6-microsecond portion of reference signal 101 at the waveform level. Note that it does not matter whether the feedback waveform is temporally aligned to the reference waveform, or vice versa, or even both waveforms temporally aligned to some other reference waveform. For the following discussion, however, it will be assumed that the feedback waveform is temporally aligned to the reference waveform.

After the feedback waveform has been temporally aligned to the reference waveform in step 204, in step 206, DPD processor 102 divides each waveform into multiple sub-waveforms. In one typical implementation, each waveform is divided into 128 sub-waveforms. Thus, for the implementation in which the feedback waveform is 106.6 microseconds long, each temporally aligned feedback sub-waveform and its corresponding reference sub-waveform are both about 833 nanoseconds long.

In step 208, each feedback sub-waveform is independently phase aligned with its corresponding reference sub-waveform, typically in a least-squares sense using Equation (1) above at the sub-waveform level. Instead of least squares, one could minimize the sum of the absolute values of the deviations, but least squares is more convenient because it leads to a closed-form expression. One could also calculate the phase angle for each sample of both waveforms and then minimize the difference, but that requires more computations.

Although it is not required, it is better to phase align the feedback sub-waveforms to the reference sub-waveforms; otherwise, phase discontinuities can be introduced into the reference waveform at the points where the sub-waveforms join up. Furthermore, the alignment scheme performed for phase does not have to be the same as the alignment scheme previously performed for time. For example, for the time alignment, the reference waveform could be aligned in time to the feedback waveform, while, for the phase alignment, each feedback sub-waveform is independently aligned in phase to its corresponding time-aligned reference waveform. For the following discussion, however, it will be assumed that each temporally aligned feedback sub-waveform is independently phase aligned to its corresponding reference sub-waveform.

In step 210, the independently phase-aligned feedback sub-waveforms are combined to form a single, combined, hybrid-aligned feedback waveform. The combined waveform is referred to as being hybrid aligned, because it is the result of (i) a single time alignment at the waveform level (e.g., the entire feedback waveform compared, in a least-squares sense, to different portions of the reference signal to identify the corresponding reference waveform) and (ii) multiple, independent phase alignments at the sub-waveform level (e.g., each feedback sub-waveform phase aligned to its corresponding time-aligned reference sub-waveform independent of all other sub-waveforms).

In step 212, the hybrid-aligned feedback waveform is compared to the original reference waveform to update the LUTs using conventional DPD processing.

Figure 3:
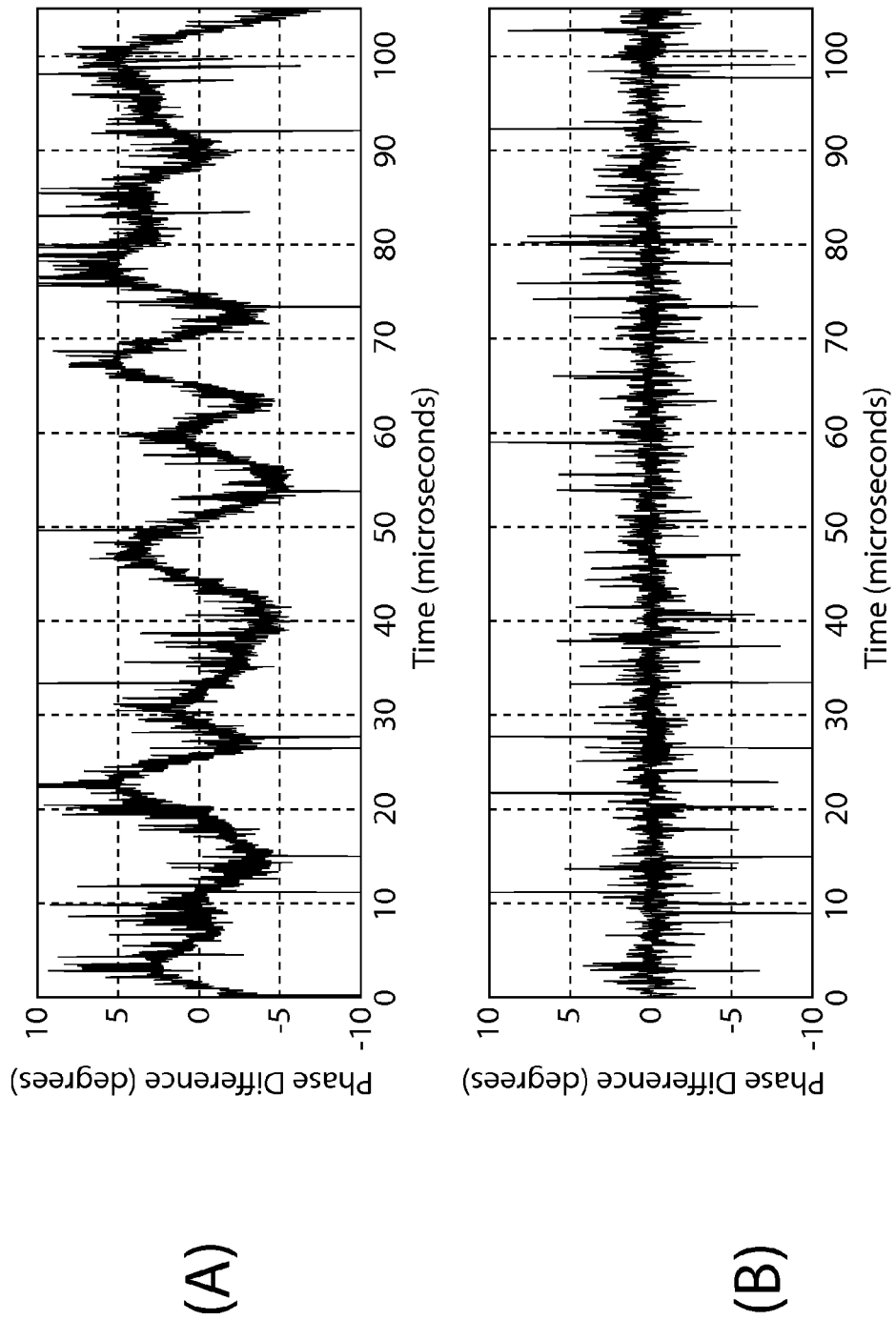
FIG. 3 graphically illustrates the results of implementing one embodiment of the present invention as compared to prior-art results.

FIG. 3 graphically illustrates the results of applying one embodiment of the present invention as compared to prior-art results. In particular, FIG. 3(A) represents the phase difference (in degrees) between an exemplary 15-MHz bandwidth reference waveform and the feedback waveform as a function of time, using the prior-art technique of aligning the entire (106.6-microsecond) feedback waveform in both time and phase at the waveform level. FIG. 3(B) represents the phase difference (in degrees) between the same two waveforms as a function of time, using an implementation of the present invention that divided the (conventionally) time-aligned feedback waveform into 128 833-nanosecond sub-waveforms for independent phase alignments at the sub-waveform level. The standard deviation of the data in FIG. 3(A) is about 3.2 degrees, while the standard deviation of the data in FIG. 3(B) is only about 0.9 degrees. Thus, virtually all of the undesired phase variation was removed using the embodiment of the present invention, resulting in a DPD reduction of greater than 10 dB in the distortion at the output of the amplifier.

The duration of the segments of the feedback waveform needs to be chosen carefully. If the duration is too short, then the effect of multiplying the segmented feedback waveform with the set of complex numbers is to remove not only the undesired phase variations, but also the phase difference caused by the AM-PM distortion, in which case, the ability to linearize the amplifier by DPD is lost. On the other hand, if the duration of the segments is too long, then phase variations within each segment are not removed, and little or no benefit is obtained. The optimum duration of the segments depends on the bandwidth of the signal being transmitted, since the bandwidth sets the time scale of the AM-PM distortion. Typically, a duration equal to 10 to 20 times the reciprocal of the signal bandwidth works well.

Broadening

The present invention has been described in the context of an embodiment in which two waveforms are initially aligned in time at the waveform level and then aligned in phase at the sub-waveform level. In an alternative embodiment, the two waveforms are aligned in both time and phase at the waveform level, where the phase-alignment is then adjusted at the sub-waveform level.

Although the present invention has been described in the context of aligning two signals in both time and phase in order to update LUTs for DPD processing in a linearized amplifier system, the present invention is not so limited. For example, the present invention can be implemented for adaptive linearized amplifier systems that align feedback and reference signals in phase, but not in time. The present invention can be implemented to linearize an analog sub-system having one or more of the following elements: baseband amplification, IF amplification, RF amplification, frequency upconversion, frequency downconversion, vector modulation. The present invention can also be implemented to align two signals in phase for applications other than linearizing non-linear systems.

Depending on the frequency requirements of the particular application and the frequency capabilities of the physical components used to implement the various elements, the upconverting and downconverting mixers may be omitted. Note that, in certain implementations, upconversion and/or downconversion may be partially or even completely implemented in the digital domain.

In addition, the present invention can be implemented in the context of a linearized system having an analog pre-distorter instead of a digital pre-distorter. In that case, the D/A and A/D converters may be omitted, and all of the processing may be implemented in the analog domain. Other hybrid embodiments are also possible where different sets of functions may be implemented in the analog domain or the digital domain.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, general-purpose computer, or other processor.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A machine-implemented method for generating a linearized output signal from an input signal, the method comprising:
    (1) applying the input signal to an adaptive pre-distorter to generate a pre-distorted signal;
    (2) applying the pre-distorted signal to a non-linear amplifier to generate the linearized output signal;
    (3) generating a feedback signal based on the linearized output signal; and
    (4) adapting the adaptive pre-distorter based on the input signal and the feedback signal by:
        (a) time aligning, at a waveform level, a feedback waveform corresponding to the feedback signal with a reference waveform corresponding to the input signal;
        (b) dividing the time-aligned feedback waveform in time into a plurality of feedback sub-waveforms, wherein each feedback sub-waveform has a shorter time interval than the feedback waveform;
        (c) dividing the reference waveform in time into a plurality of reference sub-waveforms, wherein each reference sub-waveform has a shorter time interval than the reference waveform and each reference sub-waveform corresponds to a different feedback sub-waveform;
        (d) independently phase-aligning each feedback sub-waveform to its corresponding reference sub-waveform at a sub-waveform level to form a plurality of independently phase-aligned feedback sub-waveforms;
        (e) combining the plurality of independently phase-aligned feedback sub-waveforms in time to form a hybrid-aligned feedback waveform; and
        (f) updating the adaptive pre-distorter based on the hybrid-aligned feedback waveform.

2. The invention of claim 1, wherein step (f) comprises comparing the hybrid-aligned feedback waveform to the reference waveform to characterize differences between the hybrid-aligned feedback and reference waveforms.

3. The invention of claim 1, wherein:
    the adaptive pre-distorter is a digital pre-distorter; and
    the non-linear amplifier comprises a power amplifier.

4. The invention of claim 1, wherein each phase-aligning corresponds to rotation of a complex signal vector in a complex signal domain.

5. Apparatus comprising a linearized system comprising:
    an adaptive pre-distorter configured to pre-distort an input signal to generate a pre-distorted signal;
    a non-linear amplifier configured to generate a linearized output signal from the pre-distorted signal; and
    a feedback path configured to generate a feedback waveform based on the linearized output signal, wherein the adaptive pre-distorter is configured to:
        (1) time align the feedback waveform with a corresponding reference waveform of the input signal at a waveform level;
        (2) divide the time-aligned feedback waveform in time into a plurality of feedback sub-waveforms, wherein each feedback sub-waveform has a shorter time interval than the feedback waveform;
        (3) divide the corresponding reference waveform in time into a plurality of reference sub-waveforms, wherein each reference sub-waveform has a shorter time interval than the reference waveform;

(4) independently phase align each feedback sub-waveform and its corresponding reference sub-waveform at a sub-waveform level to form a plurality of phase-aligned sub-waveforms;
(5) combine the plurality of phase-aligned sub-waveforms in time to form a hybrid-aligned waveform; and
(6) update the adaptive pre-distorter based on the hybrid-aligned waveform.

6. The invention of claim 5, wherein:
the hybrid-aligned waveform is a hybrid-aligned feedback waveform; and
the adaptive pre-distorter is updated based on a comparison of the hybrid-aligned feedback waveform and the corresponding reference waveform.

7. The invention of claim 5, wherein:
the hybrid-aligned waveform is a hybrid-aligned reference waveform; and
the adaptive pre-distorter is updated based on a comparison of the hybrid-aligned reference waveform and the corresponding feedback waveform.

8. The invention of claim 5, wherein:
the adaptive pre-distorter is an adaptive digital pre-distorter; and
the non-linear amplifier comprises a power amplifier.

9. The invention of claim 5, wherein each phase-aligning corresponds to rotation of a complex signal vector in a complex signal domain.

* * * * *